US011361947B2

(12) United States Patent
Koshimizu (10) Patent No.: US 11,361,947 B2
(45) Date of Patent: Jun. 14, 2022

(54) APPARATUS FOR PLASMA PROCESSING AND METHOD OF ETCHING

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/725,915

(22) Filed: Dec. 23, 2019

(65) Prior Publication Data

US 2020/0219706 A1    Jul. 9, 2020

(30) Foreign Application Priority Data

Jan. 9, 2019   (JP) .............................. JP2019-001662
Nov. 29, 2019  (JP) .............................. JP2019-217048

(51) Int. Cl.
H01J 37/32        (2006.01)

(52) U.S. Cl.
CPC .. *H01J 37/32642* (2013.01); *H01J 37/32174* (2013.01); *H01J 37/32697* (2013.01); *H01J 37/32724* (2013.01); *H01J 37/3244* (2013.01); *H01J 2237/002* (2013.01); *H01J 2237/24564* (2013.01); *H01J 2237/3341* (2013.01)

(58) Field of Classification Search
CPC ........... H01J 37/32642; H01J 37/32724; H01J 37/32174; H01J 37/32697; H01J 37/3244; H01J 2237/24564; H01J 2237/3341; H01J 2237/002; H01J 37/3053; H01J 37/248; H01J 37/32091; H01J 37/32183
See application file for complete search history.

(56) References Cited

U.S. PATENT DOCUMENTS 6,344,419 B1    2/2002  Forster et al.
2005/0103623 A1  5/2005  Tolmachev et al.
(Continued)

FOREIGN PATENT DOCUMENTS

JP    2000-012285 A    1/2000
JP    2000-173993 A    6/2000
(Continued)

OTHER PUBLICATIONS

Kushner et al. Ion Energyand Angular Distributions Into Small Features in Plasma Etching Reactors; The Wafer- Focus Ring Gap. AVS 54th International Symposium Oct. 2007 (Year: 2007).*

*Primary Examiner* — Binh X Tran
(74) *Attorney, Agent, or Firm* — Studebaker & Brackett PC (57) ABSTRACT

In an apparatus for plasma processing according to an exemplary embodiment, a radio frequency power source generates radio frequency power which is supplied for generation of a plasma. A bias power source supplies bias power to a lower electrode of a substrate support. The bias power varies a potential of a substrate within a cycle thereof. The radio frequency power is supplied in at least a part of a first period in the cycle, in which the potential of the substrate is relatively high. A power level of the radio frequency power is lowered in a second period in the cycle, in which the potential of the substrate is relatively low. In the first period and the second period, the sheath adjuster adjusts a position in a vertical direction of an upper end of a sheath above an edge ring.

17 Claims, 8 Drawing Sheets

(56) References Cited

U.S. PATENT DOCUMENTS

| | | | |
|---|---|---|---|
| 2009/0078678 A1* | 3/2009 | Kojima | H01J 37/32165 216/71 |
| 2009/0295295 A1 | 12/2009 | Shannon et al. | |
| 2014/0262755 A1 | 9/2014 | Deshmukh et al. | |
| 2014/0305905 A1* | 10/2014 | Yamada | H01J 37/32568 156/345.28 |
| 2015/0069912 A1* | 3/2015 | Valcore, Jr. | H01J 37/32926 315/111.21 |
| 2016/0126069 A1 | 5/2016 | Kwon et al. | |
| 2016/0247666 A1* | 8/2016 | Urakawa | H01J 37/32174 |
| 2019/0206703 A1* | 7/2019 | Zhao | H05H 1/46 |
| 2019/0362942 A1 | 11/2019 | Shoeb et al. | |
| 2019/0371581 A1* | 12/2019 | Wang | H01J 37/32926 |

FOREIGN PATENT DOCUMENTS

| | | |
|---|---|---|
| JP | 2005-072518 A | 3/2005 |
| JP | 2007-258417 A | 10/2007 |
| JP | 2010-171320 A | 8/2010 |
| JP | 2010-283028 A | 12/2010 |
| JP | 2017-147370 A | 8/2017 |
| JP | 2018-073904 A | 5/2018 |

* cited by examiner

APPARATUS FOR PLASMA PROCESSING AND METHOD OF ETCHING

CROSS-REFERENCE TO RELATED APPLICATIONS

This application is based on and claims the benefit of priority from Japanese Patent Application No. 2019-001662 filed on Jan. 9, 2019 and Japanese Patent Application No. 2019-217048 filed on Nov. 29, 2019, the entire contents of which are incorporated herein by reference.

FIELD

Exemplary embodiments of the present disclosure relate to an apparatus for plasma processing and a method of etching.

BACKGROUND

In plasma etching of a substrate, a plasma processing apparatus is used. The plasma processing apparatus is provided with a chamber, an electrostatic chuck, and a lower electrode. The electrostatic chuck and the lower electrode are provided in the chamber. The electrostatic chuck is provided on the lower electrode. The electrostatic chuck supports a focus ring placed thereon. The electrostatic chuck supports a substrate disposed in a region surrounded by the focus ring. When etching is performed in the plasma processing apparatus, a gas is supplied into the chamber. Further, radio frequency power is supplied to the lower electrode. A plasma is formed from the gas in the chamber. The substrate is etched by chemical species such as ions and radicals from the plasma.

If the plasma etching is performed, the focus ring wears down, so that the thickness of the focus ring is reduced. If the thickness of the focus ring is reduced, a position of an upper end of a plasma sheath (hereinafter referred to as a "sheath") above the focus ring is lowered. The position in a vertical direction of the upper end of the sheath above the focus ring should be equal to the position in the vertical direction of the upper end of the sheath above the substrate. Therefore, Japanese Patent Application Laid-Open Publication No. 2007-258417 and Japanese Patent Application Laid-Open Publication No. 2010-283028 disclose plasma processing apparatuses making it possible to adjust the position in the vertical direction of the upper end of the sheath above the focus ring. The plasma processing apparatuses disclosed in these literatures are configured to apply a direct-current voltage to the focus ring.

SUMMARY

In an exemplary embodiment, an apparatus for plasma processing is provided. The apparatus includes a chamber, a substrate support, a sheath adjuster, a radio frequency power source, a bias power source, and a controller. The substrate support has a lower electrode and an electrostatic chuck. The electrostatic chuck is provided on the lower electrode. The substrate support is configured to support a substrate which is placed thereon in the chamber. The sheath adjuster is configured to adjust a position in a vertical direction of an upper end of a sheath above an edge ring. The edge ring is disposed to surround an edge of the substrate. The radio frequency power source is configured to generate radio frequency power which is supplied to generate a plasma from a gas in the chamber. The radio frequency power has a first frequency. The bias power source is configured to generate bias power. The bias power source is electrically connected to the lower electrode. The bias power is set to vary a potential of the substrate placed on the electrostatic chuck within a cycle which is defined at a second frequency. The second frequency is lower than the first frequency. The controller is configured to control the sheath adjuster and the radio frequency power source. The controller is configured to control the radio frequency power source to supply the radio frequency power in at least a part of a first period in the cycle. In the first period, the potential of the substrate placed on the electrostatic chuck is higher than an average value of the potential of the substrate in the cycle. The controller is configured to control the radio frequency power source to reduce, in a second period in the cycle, a power level of the radio frequency power to be lower than a power level of the radio frequency power in the first period. In the second period, the potential of the substrate placed on the electrostatic chuck is lower than the average value of the potential of the substrate in the cycle. The controller is configured to control the sheath adjuster to adjust the position in the vertical direction of the upper end of the sheath in the first period and the second period.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, an apparatus for plasma processing is provided. The apparatus includes a chamber, a substrate support, a sheath adjuster, a radio frequency power source, a bias power source, and a controller. The substrate support has a lower electrode and an electrostatic chuck. The electrostatic chuck is provided on the lower electrode. The substrate support is configured to support a substrate which is placed thereon in the chamber. The sheath adjuster is configured to adjust a position in a vertical direction of an upper end of a sheath above an edge ring. The edge ring is disposed to surround an edge of the substrate. The radio frequency power source is configured to generate radio frequency power which is supplied to generate a plasma from a gas in the chamber. The radio frequency power has a first frequency. The bias power source is configured to generate bias power. The bias power source is electrically connected to the lower electrode. The bias power is set to vary a potential of the substrate placed on the electrostatic chuck within a cycle which is defined at a second frequency. The second frequency is lower than the first frequency. The controller is configured to control the sheath adjuster and the radio frequency power source. The controller is configured to control the radio frequency power source to supply the radio frequency power in at least a part of a first period in the cycle. In the first period, the potential of the substrate placed on the electrostatic chuck is higher than an average value of the potential of the substrate in the cycle. The controller is configured to control the radio frequency power source to reduce, in a second period in the cycle, a power level of the radio frequency power to be lower than a power level of the radio frequency power in the first period. In the second period, the potential of the substrate placed on the electrostatic chuck is lower than the average value of the potential of the substrate in the cycle. The controller is configured to control the sheath adjuster to adjust the position in the vertical direction of the upper end of the sheath in the first period and the second period.

If the position in the vertical direction of the upper end of the sheath is adjusted by the sheath adjuster, an impedance of a path of the radio frequency power that reaches the plasma via the edge ring increases. As a result, the power level of the radio frequency power which is supplied to the edge ring is lowered, and the power level of the radio frequency power which is supplied to the substrate relatively increases. Therefore, a difference is generated between an etching rate at the edge of the substrate and an etching rate of the substrate inside the edge. In the embodiment describe above, the radio frequency power is supplied in at least a part of the first period in the cycle of the bias power. In the first period, the potential difference between the substrate and the plasma is small, and thus the progress of etching of the substrate is relatively slow or etching of the substrate is not substantially performed. On the other hand, in the second period, the potential difference between the substrate and the plasma is large, and thus the etching of the substrate proceeds. However, the power level of the radio frequency power is set to a low level or zero. Therefore, according to the embodiment described above, even if the adjustment of the position in the vertical direction of the upper end of the sheath is performed by the sheath adjuster, the difference between the etching rate at the edge of the substrate and the etching rate of the substrate inside the edge becomes small.

In an exemplary embodiment, the controller may control the radio frequency power source to stop the supply of the radio frequency power in the second period.

In an exemplary embodiment, the sheath adjuster may be configured to apply a voltage to the edge ring to adjust the position in the vertical direction of the upper end of the sheath.

In an exemplary embodiment, the sheath adjuster may be configured to move the edge ring upward to adjust the position in the vertical direction of the upper end of the sheath.

In an exemplary embodiment, the bias power source may be configured to supply, as the bias power, radio frequency bias power having the second frequency to the lower electrode.

In an exemplary embodiment, the first period may be a period in which the radio frequency bias power which is output from the bias power source has a positive potential. The second period may be a period in which the radio frequency bias power which is output from the bias power source has a negative potential.

In an exemplary embodiment, the bias power source may be configured to apply, as the bias power, a pulsed direct-current voltage to the lower electrode at the cycle which is defined at the second frequency.

In an exemplary embodiment, the first period may be a period in which the pulsed direct-current voltage is not applied to the lower electrode. The second period may be a period in which the pulsed negative direct-current voltage having a negative polarity is applied to the lower electrode.

In an exemplary embodiment, the apparatus may further include a voltage sensor configured to measure the potential of the substrate.

In another exemplary embodiment, a method of etching in an apparatus for plasma processing is provided. The apparatus includes a chamber, a substrate support, a sheath adjuster, a radio frequency power source, and a bias power source. The substrate support has a lower electrode and an electrostatic chuck. The electrostatic chuck is provided on the lower electrode. The substrate support is configured to support a substrate which is placed thereon in the chamber. The sheath adjuster is configured to adjust a position in a vertical direction of an upper end of a sheath above an edge ring. The edge ring is disposed to surround an edge of the substrate. The radio frequency power source is configured to generate radio frequency power which is supplied to generate a plasma from a gas in the chamber. The radio frequency power has a first frequency. The bias power source is configured to generate bias power. The bias power source is electrically connected to the lower electrode. The bias power is set to vary a potential of the substrate placed on the electrostatic chuck within a cycle which is defined at a second frequency. The second frequency is lower than the first frequency. The method is performed in a state where the substrate is placed on the electrostatic chuck. The method includes supplying the radio frequency power in at least a part of a first period in the cycle. In the first period, the potential of the substrate is higher than an average value of the potential of the substrate in the cycle. The method further includes reducing, in a second period in the cycle, a power level of the radio frequency power to be lower than a power level of the radio frequency power in the first period. In the second period, the potential of the substrate is lower than the average value of the potential of the substrate in the cycle. Ions in the plasma generated in the chamber in the first period are accelerated toward the substrate in the second period, whereby the substrate placed on the electrostatic chuck is etched. In the first period and the second period, the position in the vertical direction of the upper end of the sheath is adjusted by the sheath adjuster.

In an exemplary embodiment, in the second period, supply of the radio frequency power may be stopped.

In an exemplary embodiment, the sheath adjuster may be configured to apply a voltage to the edge ring to adjust the position in the vertical direction of the upper end of the sheath.

In an exemplary embodiment, the sheath adjuster may be configured to move the edge ring upward to adjust the position in the vertical direction of the upper end of the sheath.

In an exemplary embodiment, the bias power source may be configured to supply, as the bias power, radio frequency bias power having the second frequency to the lower electrode.

In an exemplary embodiment, the first period may be a period in which the radio frequency bias power which is output from the bias power source has a positive potential. The second period may be a period in which the radio frequency bias power which is output from the bias power source has a negative potential.

In an exemplary embodiment, the bias power source may be configured to apply, as the bias power, a pulsed direct-current voltage to the lower electrode at the cycle which is defined at the second frequency.

In an exemplary embodiment, the first period may be a period in which the pulsed direct-current voltage is not applied to the lower electrode. The second period may be a period in which the pulsed negative direct-current voltage having a negative polarity is applied to the lower electrode.

Hereinafter, various exemplary embodiments will be described in detail with reference to the drawings. In the respective drawings, identical or equivalent parts are denoted by the same reference symbols.

Figure 1:
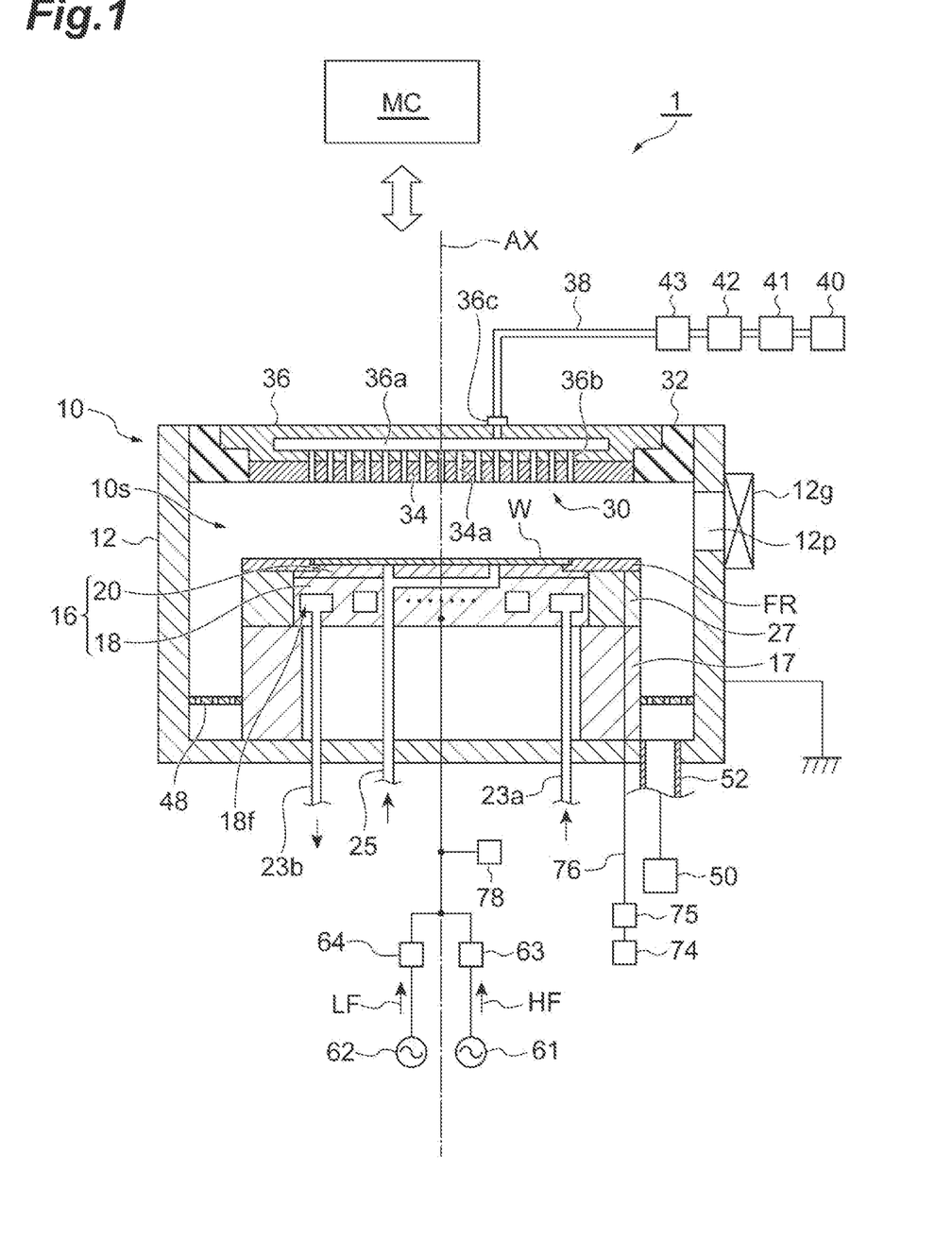
FIG. 1 schematically illustrates a plasma processing apparatus according to an exemplary embodiment.

FIG. 1 schematically illustrates a plasma processing apparatus according to an exemplary embodiment. An apparatus shown in FIG. 1 (i.e. a plasma processing apparatus 1) is a capacitively coupled plasma processing apparatus. The plasma processing apparatus 1 is provided with a chamber 10. The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. The film may be a film formed by anodization or a ceramic film such as a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W which is placed thereon in the chamber 10. The substrate W has a substantially disk shape. The substrate support 16 is supported by the support 17. The support 17 extends upward from a bottom portion of the chamber body 12. The support 17 has a substantially cylindrical shape. The support 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, a liquid refrigerant or a refrigerant (for example, chlorofluorocarbon) that cools the lower electrode 18 by vaporization thereof is used. A supply device of the heat exchange medium (for example, a chiller unit) is connected to the flow path 18f. The supply device is provided outside the chamber 10. The heat exchange medium is supplied to the flow path 18f from the supply device 18f through a pipe 23a. The heat exchange medium supplied to the flow path 18f is returned to the supply device through a pipe 23b.

The electrostatic chuck 20 is provided on the lower electrode 18. The substrate W is placed on the electrostatic chuck 20 and held by the electrostatic chuck 20 when it is processed in the internal space 10s.

The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX. The electrode of the electrostatic chuck 20 is provided in the main body. The electrode of the electrostatic chuck 20 has a film shape. A direct-current power source is electrically connected to the electrode of the electrostatic chuck 20 through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The electrostatic chuck 20 includes a substrate placing region. The substrate placing region is a region having a substantially disk shape. The central axis of the substrate placing region substantially coincides with the axis AX. The substrate W is placed on the upper surface of the substrate placing region when it is processed in the chamber 10.

In an exemplary embodiment, the electrostatic chuck 20 may further include an edge ring placing region. The edge ring placing region extends in a circumferential direction to surround the substrate placing region around the central axis of the electrostatic chuck 20. An edge ring FR is mounted on the upper surface of the edge ring placing region. The edge ring FR has a ring shape. The edge ring FR is placed on the edge ring placing region such that the central axis thereof coincides with the axis AX. The substrate W is disposed in a region surrounded by the edge ring FR. That is, the edge ring FR is disposed to surround the edge of the substrate W. The edge ring FR may have electrical conductivity. The edge ring FR is formed of, for example, silicon or silicon carbide. The edge ring FR may be formed of a dielectric such as quartz.

The plasma processing apparatus 1 can be further provided with a gas supply line 25. The gas supply line 25 supplies a heat transfer gas, for example, He gas, from a gas supply mechanism to a gap between the upper surface of the electrostatic chuck 20 and the rear surface (lower surface) of the substrate W.

The plasma processing apparatus 1 can be further provided with an insulating region 27. The insulating region 27 is disposed on the support 17. The insulating region 27 is disposed outside the lower electrode 18 in a radial direction with respect to the axis AX. The insulating region 27 extends in the circumferential direction along the outer peripheral surface of the lower electrode 18. The insulating region 27 is formed of an insulator such as quartz. The edge ring FR is placed on the insulating region 27 and the edge ring placing region.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a top plate 34 and a support 36. The lower surface of the top plate 34 defines the internal space 10s. A plurality of gas discharge holes 34a are formed in the top plate 34. Each of the plurality of gas discharge holes 34a penetrates the top plate 34 in a plate thickness direction (the vertical direction). Although being not limited, the top plate 34 is formed of silicon, for example. Alternatively, the top plate 34 can have a structure in which a plasma-resistant film is provided on the surface of a member made of aluminum. The film can be a film formed by anodization or a ceramic film such as a film formed of yttrium oxide.

The support 36 detachably supports the top plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply one or more gases from one or more gas sources selected from the plurality of gas sources of the gas source group 40 to the internal space 10s at individually adjusted flow rates.

A baffle plate 48 is provided between the substrate support 16 or the support 17 and the side wall of the chamber body 12. The baffle plate 48 can be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 includes a pressure controller such as an automatic pressure control valve, and a vacuum pump such as a turbo molecular pump, and is capable of reducing the pressure in the internal space 10s.

The plasma processing apparatus 1 is further provided with a radio frequency power source 61. The radio frequency power source 61 is a power source which generates radio frequency power HF. The radio frequency power HF is used to generate a plasma from the gas in the chamber 10. The radio frequency power HF has a first frequency. The first frequency is a frequency in the range of 27 to 100 MHz, for example, a frequency of 40 MHz or 60 MHz. The radio frequency power source 61 is connected to the lower electrode 18 through a matching circuit 63 to supply the radio frequency power HF to the lower electrode 18. The matching circuit 63 is configured to match the output impedance of the radio frequency power source 61 with the impedance on the load side (the lower electrode 18 side). The radio frequency power source 61 may not be electrically connected to the lower electrode 18 and may be connected to the upper electrode 30 through the matching circuit 63.

The plasma processing apparatus 1 is further provided with a bias power source 62. The bias power source 62 is electrically connected to the lower electrode 18. The bias power source 62 generates bias power. The bias power is used to draw ions into the substrate W. The bias power is set to vary the potential of the substrate W placed on the electrostatic chuck 20 within a cycle $P_B$ which is defined at a second frequency. The second frequency is lower than the first frequency.

Figure 2:
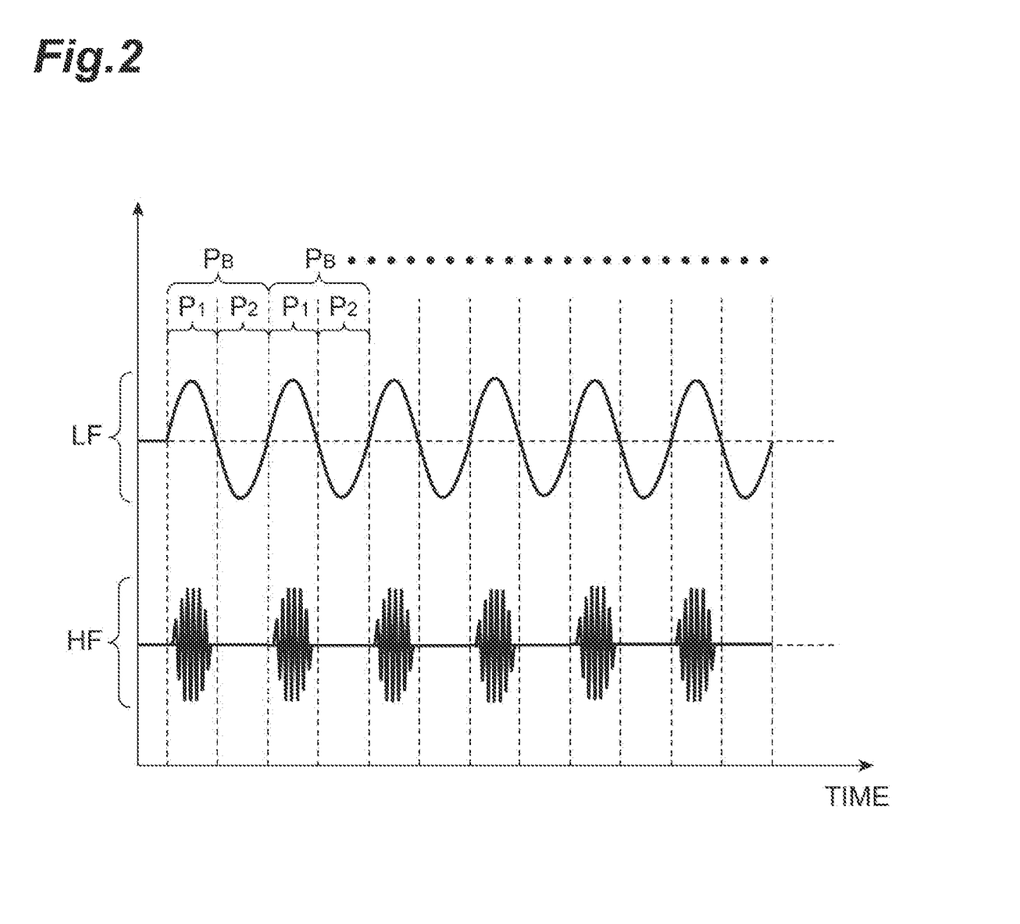
FIG. 2 is a timing chart showing radio frequency power and bias power which are used in a plasma processing apparatus according to an exemplary embodiment.

FIG. 2 is a timing chart showing radio frequency power and bias power which are used in a plasma processing apparatus according to an exemplary embodiment. In an embodiment, as shown in FIG. 2, the bias power is radio frequency bias power LF. In this embodiment, the second frequency, that is, the frequency of the radio frequency bias power LF is a frequency in a range of 50 kHz to 27 MHz, and is, for example, 400 kHz. In this embodiment, the bias power source 62 is connected to the lower electrode 18 through a matching circuit 64 to supply the radio frequency bias power LF to the lower electrode 18. The matching circuit 64 is configured to match the output impedance of the bias power source 62 with the impedance on the load side (the lower electrode 18 side).

In a case where plasma etching is performed in the plasma processing apparatus 1, a gas is supplied to the internal space 10s. Then, the radio frequency power HF and the bias power are supplied, whereby the gas is excited in the internal space 10s. As a result, a plasma is generated in the internal space 10s. The substrate W is etched by chemical species such as ions and/or radicals from the generated plasma. That is, the plasma etching is performed.

Figure 3A:
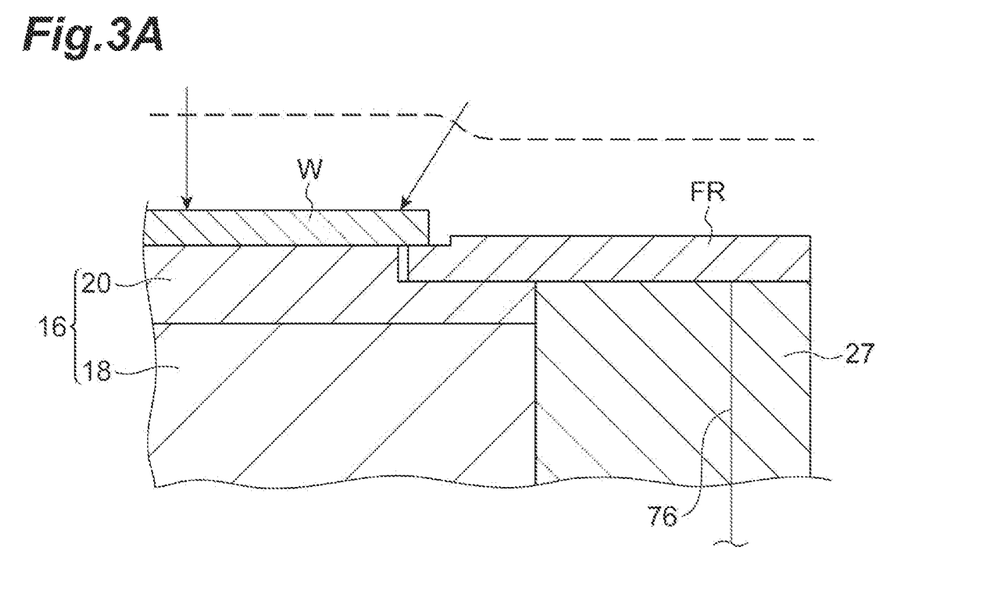
FIG. 3A illustrates an example of a position in a vertical direction of an upper end of a sheath in a state where an edge ring has worn down.
Figure 3B:
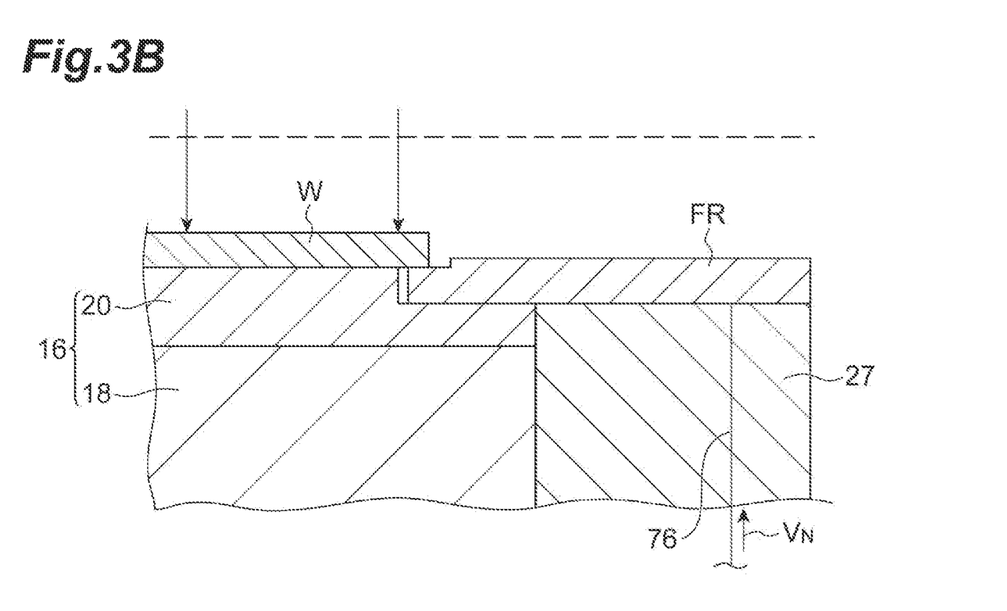
FIG. 3B illustrates an example of a corrected position in the vertical direction of the upper end of the sheath.

Hereinafter, FIGS. 3A and 3B are referred to. FIG. 3A illustrates an example of a position in a vertical direction of an upper end of a sheath in a state where an edge ring has worn down. FIG. 3B illustrates an example of a corrected position in the vertical direction of the upper end of the sheath. In each of FIG. 3A and FIG. 3B, the position in the vertical direction of the upper end (hereinafter referred to as an "upper end position") of the sheath is indicated by a broken line. Further, in each of FIG. 3A and FIG. 3B, a traveling direction of ions to the substrate W is indicated by an arrow.

If the plasma etching of the substrate W is performed, the edge ring FR wears down as shown in FIG. 3A. If the edge ring FR has worn down, the thickness of the edge ring FR is reduced, so that the position in the vertical direction of the upper surface of the edge ring FR is lowered. If the position in the vertical direction of the upper surface of the edge ring FR is lowered, the upper end position of the sheath above the edge ring FR becomes lower than the upper end position of the sheath above the substrate W. As a result, the upper end of the sheath is inclined in the vicinity of the edge of the substrate W, and thus the traveling direction of ions which are supplied to the edge of the substrate W becomes a direction inclined with respect to the vertical direction.

In order to correct the traveling direction of ions to the vertical direction (that is, the direction perpendicular to the edge of the substrate W), the plasma processing apparatus 1 is further provided with a sheath adjuster 74, as shown in FIG. 1. The sheath adjuster 74 is configured to adjust the upper end position of the sheath above the edge ring FR. The sheath adjuster 74 adjusts the upper end position of the sheath above the edge ring FR to eliminate or reduce the difference between the upper end position of the sheath above the edge ring FR and the upper end position of the sheath above the substrate W.

In an embodiment, the sheath adjuster 74 is a power source configured to apply a voltage $V_N$ to the edge ring FR. The voltage $V_N$ may have a negative polarity. In the embodiment, the sheath adjuster 74 is connected to the edge ring FR through a filter 75 and a conducting wire 76. The filter 75 is a filter for blocking or reducing radio frequency power flowing into the sheath adjuster 74.

The voltage $V_N$ may be a direct-current voltage or a radio frequency voltage. The level of the voltage $V_N$ determines the adjustment amount of the upper end position of the sheath. The adjustment amount of the upper end position of the sheath, that is, the level of the voltage $V_N$ is determined according to a parameter that reflects the thickness of the edge ring FR. This parameter may be a measured value of the thickness of the edge ring FR which is measured optically or electrically, the position in the vertical direction of the upper surface of the edge ring FR which is measured optically or electrically, or the length of a time when the edge ring FR is exposed to the plasma. The level of the voltage $V_N$ is determined using a predetermined relationship between such a parameter and the level of the voltage $V_N$. For example, the predetermined relationship between the parameter and the level of the voltage $V_N$ is determined in advance such that the absolute value of the voltage $V_N$ increases as the thickness of the edge ring FR decreases. If the voltage $V_N$ having the determined level is applied to the edge ring FR, as shown in FIG. 3B, the difference between the upper end position of the sheath above the edge ring FR and the upper end position of the sheath above the substrate W is eliminated or reduced.

The voltage $V_N$ may be a pulsed radio frequency voltage or a pulsed direct-current voltage. That is, the voltage $V_N$ may be periodically applied to the edge ring FR. In a case where as the voltage $V_N$, the pulsed direct-current voltage is periodically applied to the edge ring FR, the level of the voltage $V_N$ may change during the period in which the voltage $V_N$ is applied to the edge ring FR.

If the upper end position of the sheath is corrected by the sheath adjuster 74, the impedance of the path of the radio frequency power which reaches the plasma via the edge ring increases. This is because the thickness of the sheath increases above the edge ring FR if the upper end position of the sheath is adjusted by applying the voltage $V_N$ to the edge ring FR. If the impedance of the path of the radio frequency power which reaches the plasma via the edge ring increases, the power level of the radio frequency power which is supplied to the edge ring is lowered. Further, if the impedance of the path of the radio frequency power which reaches the plasma via the edge ring increases, the power level of the radio frequency power which is supplied to the substrate W increases. As a result, the etching rate of the substrate W inside the edge becomes higher than the etching rate at the edge of the substrate W.

In the plasma processing apparatus 1, a supply timing of the radio frequency power HF is controlled by a controller MC to reduce the difference between the etching rate at the edge of the substrate and the etching rate of the substrate inside the edge.

The controller MC is a computer which includes a processor, a storage device, an input device, a display device, and the like, and controls each part of the plasma processing apparatus 1. The controller MC executes a control program stored in the storage device and controls each part of the plasma processing apparatus 1, based on recipe data stored in the storage device. A process designated by the recipe data is executed in the plasma processing apparatus 1 by the control by the controller MC. A method of etching according to an embodiment to be described later can be executed in the plasma processing apparatus 1 by the control of each part of the plasma processing apparatus 1 by the controller MC.

The controller MC can determine the level of the voltage $V_N$, as described above. The predetermined relationship between the parameter described above and the level of the voltage $V_N$ may be stored in the storage device of the controller MC as a function or table format data. The controller MC can control the sheath adjuster 74 to apply the voltage $V_N$ having the determined level to the edge ring FR.

The controller MC controls the radio frequency power source 61 to supply the radio frequency power HF in at least a part of a first period $P_1$ in the cycle $P_B$. The radio frequency power HF may be supplied in the whole of the first period $P_1$. In the first period $P_1$, the potential of the substrate W placed on the electrostatic chuck 20 is higher than the average value $V_{AVE}$ of the potential of the substrate W in the cycle $P_B$. The controller MC controls the radio frequency power source 61 to reduce, in a second period $P_2$ in the cycle $P_B$, the power level of the radio frequency power HF to be lower than the power level of the radio frequency power HF in the first period $P_1$. In the second period $P_2$, the potential of the substrate W placed on the electrostatic chuck 20 is lower than the average value $V_{AVE}$. In an embodiment, the controller MC may control the radio frequency power source 61 to stop supply of the radio frequency power HF in the second period $P_2$. The controller MC controls the sheath adjuster 74 to adjust the position in the vertical direction of the upper end of the sheath in the first period $P_1$ and the second period $P_2$.

In the plasma processing apparatus 1, the radio frequency power HF is supplied in at least a part of the first period $P_1$ in the cycle $P_B$ of the bias power. In the first period $P_1$, the potential difference between the substrate W and the plasma is small, and thus the progress of the etching of the substrate W is relatively slow, or the etching of the substrate W is not substantially performed. On the other hand, in the second period $P_2$, the potential difference between the substrate W and the plasma is large and the etching of the substrate W proceeds. However, the power level of the radio frequency power HF is set to a low level or zero. Therefore, according to the plasma processing apparatus 1, even if the adjustment of the position in the vertical direction of the upper end of the sheath is performed by the sheath adjuster 74, the difference between the etching rate at the edge of the substrate W and the etching rate of the substrate inside the edge becomes small.

In an embodiment, as shown in FIG. 2, the radio frequency bias power LF is used as the bias power. The first period $P_1$ may be a period in which the radio frequency bias power LF which is output from the bias power source 62 has a positive potential. The second period $P_2$ may be a period in which the radio frequency bias power LF which is output from the bias power source 62 has a negative potential. In this embodiment, a synchronization pulse, a delay time length, and a supply time length are provided from the controller MC to the radio frequency power source 61. The synchronization pulse is synchronized with the radio frequency bias power LF. The delay time length is a delay time length from the point in time of the start of the cycle $P_B$ which is specified by the synchronization pulse. The supply time length is the length of a supply time of the radio frequency power HF. The radio frequency power source 61 supplies the radio frequency power HF to the lower electrode 18 during the supply time length from a point in time delayed by the delay time length with respect to the point in time of the start of the cycle $P_B$. As a result, the radio frequency power HF is supplied to the lower electrode 18 in the first period $P_1$. The delay time length may be zero.

In an embodiment, the plasma processing apparatus 1 may be further provided with a voltage sensor 78. The voltage sensor 78 is configured to directly or indirectly measure the potential of the substrate W. In the example shown in FIG. 1, the voltage sensor 78 is configured to measure the potential of the lower electrode 18. Specifically, the voltage sensor 78 measures the potential of the power supply path connected between the lower electrode 18 and the bias power source 62. In this embodiment, the controller MC determines a period in which the potential of the substrate W measured by the voltage sensor 78 is higher than the average value $V_{AVE}$ of the potential of the substrate W in the cycle $P_B$ as the first period $P_1$. The controller MC controls the radio frequency power source 61 to supply the radio frequency power HF in the first period $P_1$. The controller MC determines a period in which the potential of the substrate W measured by the voltage sensor 78 is lower than the average value $V_{AVE}$ as the second period $P_2$. The controller MC controls the radio frequency power source 61 to reduce the power level of the radio frequency power HF in the second period $P_2$ to be lower than the power level of the radio frequency power HF in the first period $P_1$, or stop the supply of the radio frequency power HF. The average value $V_{AVE}$ of the potential of the substrate W may be a value determined in advance.

Figure 4:
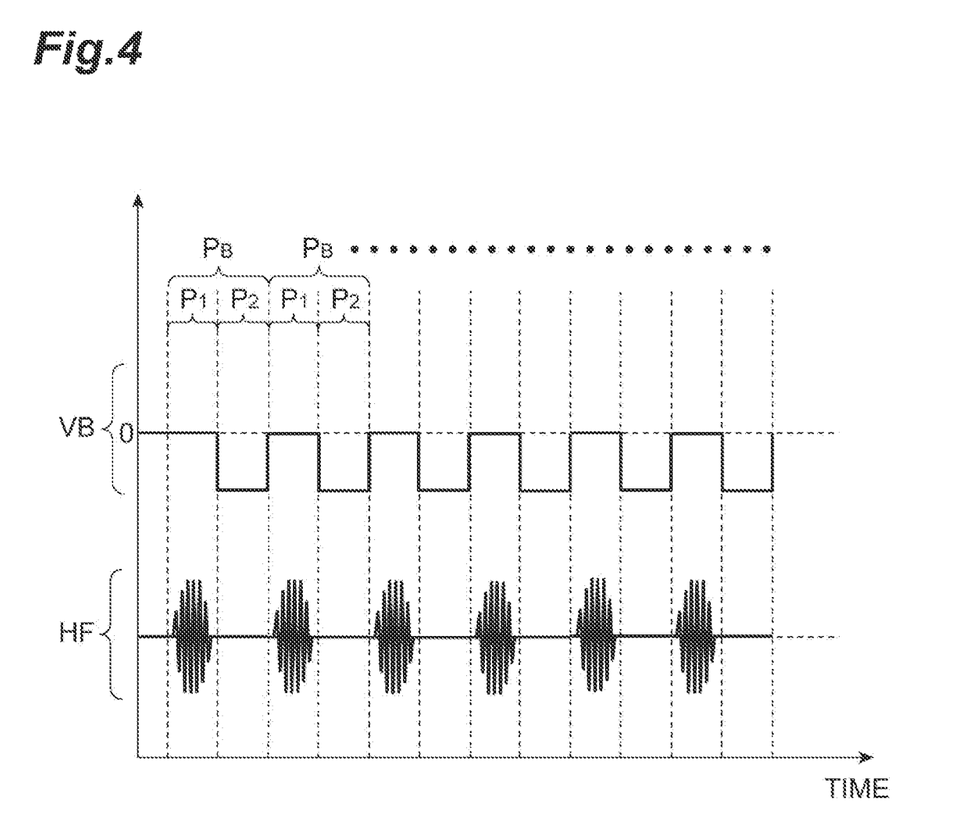
FIG. 4 is a timing chart showing radio frequency power and bias power which are used in a plasma processing apparatus according to another exemplary embodiment.

Hereinafter, another embodiment will be described. FIG. 4 is a timing chart showing radio frequency power and bias power which are used in a plasma processing apparatus according to another exemplary embodiment. In the plasma processing apparatus 1 according to another exemplary embodiment, the bias power source 62 is configured to apply a pulsed direct-current voltage VB as the bias power to the lower electrode 18. The direct-current voltage VB is applied to the lower electrode 18 at a repetition frequency that is the second frequency. In an embodiment in which the pulsed direct-current voltage VB is used, the second frequency is 50 kHz or more and 27 MHz or less. In this embodiment, the matching circuit 64 can be omitted. In this embodiment, the first period $P_1$ may be a period in which the direct-current voltage VB is not applied to the lower electrode. The second period $P_2$ may be a period in which the pulsed direct-current voltage VB having a negative polarity is applied to the lower electrode. Alternatively, as described above, the first period $P_1$ and the second period $P_2$ may be determined from the potential of the substrate W measured by the voltage sensor 78. In other respects, the plasma processing apparatus 1 that uses the direct-current voltage VB as the bias power may be the same as the plasma processing apparatus 1 that uses the radio frequency bias power LF as the bias power.

Figure 5:
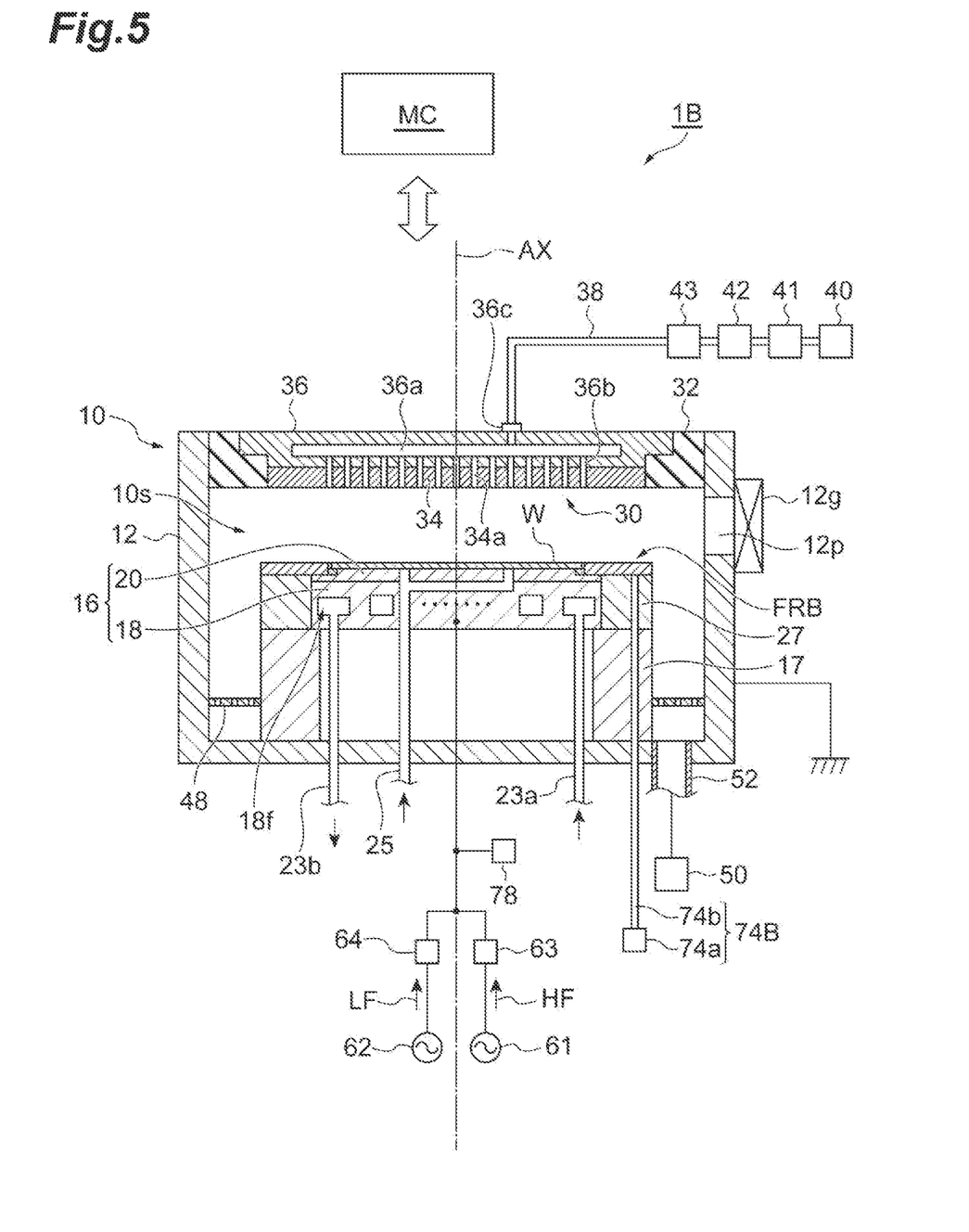
FIG. 5 schematically illustrates a plasma processing apparatus according to still another exemplary embodiment.
Figure 6A:
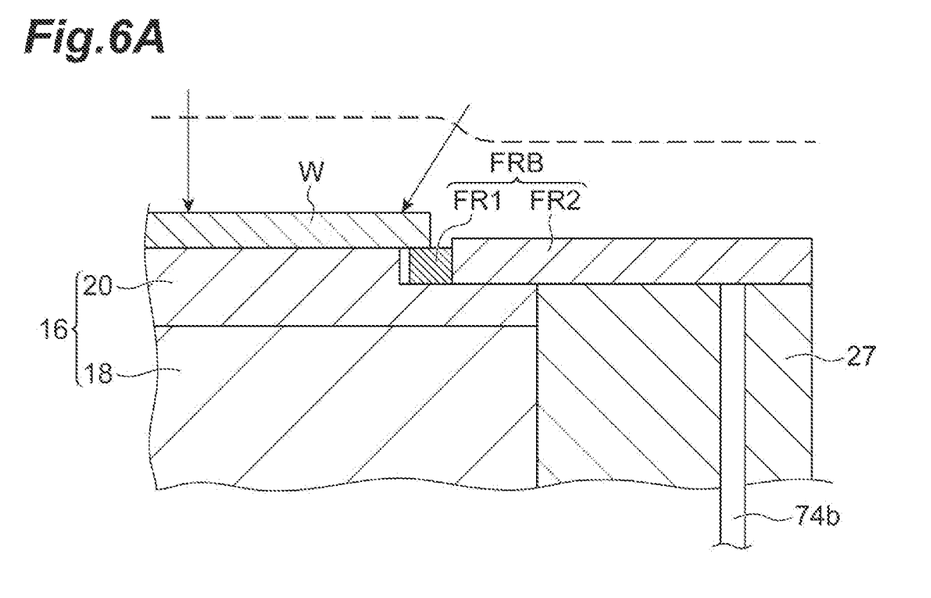
FIG. 6A illustrates an example of a position in a vertical direction of an upper end of a sheath in a state where an edge ring has worn down.
Figure 6B:
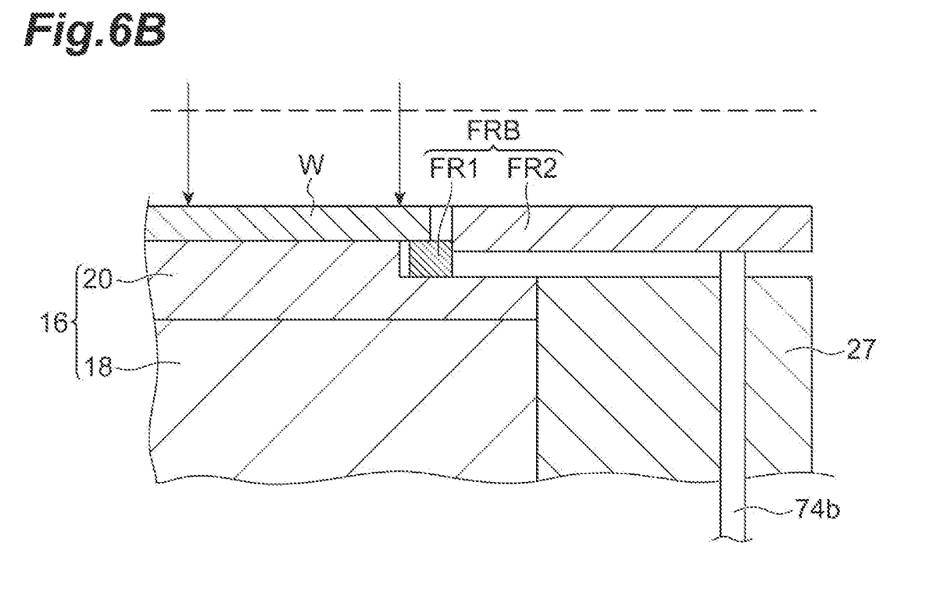
FIG. 6B illustrates an example of a corrected position in the vertical direction of the upper end of the sheath.

Hereinafter, a plasma processing apparatus according to a still another embodiment will be described with reference to FIGS. 5, 6A, and 6B. FIG. 5 schematically illustrates the plasma processing apparatus according to still another exemplary embodiment. FIG. 6A illustrates an example of a position in a vertical direction of an upper end of the sheath in a state where an edge ring has worn down, and FIG. 6B illustrates an example of a corrected position in the vertical direction of the upper end of the sheath. In each of FIG. 6A and FIG. 6B, the upper end position of the sheath is indicated by a broken line. Further, in each of FIG. 6A and FIG. 6B, a traveling direction of ions to the substrate W is indicated by an arrow.

A plasma processing apparatus 1B shown in FIG. 5 is different from the plasma processing apparatus 1 in that the plasma processing apparatus 1B uses an edge ring FRB instead of the edge ring FR. Further, the plasma processing apparatus 1B is different from the plasma processing apparatus 1 in that the plasma processing apparatus 1B is provided with a sheath adjuster 74B instead of the sheath adjuster 74. In other respects, the configuration of the plasma processing apparatus 1B may be the same as the configuration of the plasma processing apparatus 1.

As shown in FIGS. 6A and 6B, the edge ring FRB has a first annular part FR1 and a second annular part FR2. The first annular part FR1 and the second annular part FR2 are separated from each other. The first annular part FR1 has an annular plate shape and is placed on the edge ring placing region to extend around the axis AX. The substrate W is placed on the substrate placing region such that the edge thereof is located on/above the first annular part FR1. The second annular part FR2 has an annular plate shape and is placed on the edge ring placing region to extend around the axis AX. The second annular part FR2 is located outside the first annular part FR1 in the radial direction.

The sheath adjuster 74B is a movement device configured to move the edge ring FRB upward to adjust the position in the vertical direction of the upper surface of the edge ring FRB. Specifically, the sheath adjuster 74B is configured to move the second annular part FR2 upward to adjust the position in the vertical direction of the upper surface of the second annular part FR2. In an example, the sheath adjuster 74B includes a drive device 74a and a shaft 74b. The shaft 74b supports the second annular part FR2 and extends downward from the second annular part FR2. The drive device 74a is configured to generate a driving force for moving the second annular part FR2 in the vertical direction through the shaft 74b.

If the plasma etching of the substrate W is performed, the edge ring FRB wears down as shown in FIG. 6A. If the edge ring FRB has worn down, the thickness of the second annular part FR2 decreases, and thus the position in the vertical direction of the upper surface of the second annular part FR2 is lowered. If the position in the vertical direction of the upper surface of the second annular part FR2 is lowered, the upper end position of the sheath on/above the edge ring FRB becomes lower than the upper end position of the sheath above the substrate W. As a result, the upper end of the sheath is inclined in the vicinity of the edge of the substrate W, so that the traveling direction of ions which are supplied to the edge of the substrate W becomes a direction inclined with respect to the vertical direction.

In order to correct the traveling direction of ions to the vertical direction, the sheath adjuster 74B is configured to adjust the upper end position of the sheath on/above the edge ring FRB. The sheath adjuster 74B adjusts the upper end position of the sheath on/above the edge ring FRB to eliminate or reduce the difference between the upper end position of the sheath on/above the edge ring FRB and the upper end position of the sheath above the substrate W. Specifically, the sheath adjuster 74B moves the second annular part FR2 upward to make the position in the vertical direction of the upper surface of the second annular part FR2 coincide with the position in the vertical direction of the upper surface of the substrate W on the electrostatic chuck 20.

The adjustment amount of the upper end position of the sheath, that is, the amount of movement of the second annular part FR2 is determined according to a parameter which reflects the thickness of the edge ring FRB, that is, the thickness of the second annular part FR2. This parameter may be the measured value of the thickness of the second annular part FR2 which is measured optically or electrically, the position in the vertical direction of the upper surface of the second annular part FR2 which is measured optically or electrically, or the length of a time when the edge ring FRB is exposed to the plasma. The amount of movement of the second annular part FR2 is determined using a predetermined relationship between such a parameter and the amount of movement of the second annular part FR2. For example, the predetermined relationship between the parameter and the amount of movement of the second annular part FR2 is determined in advance such that the amount of movement of the second annular part FR2 increases as the thickness of the second annular part FR2 decreases. If the second annular part FR2 is moved upward by the determined amount of movement, as shown in FIG. 6B, the difference between the upper end position of the sheath on/above the edge ring FRB and the upper end position of the sheath above the substrate W is eliminated or reduced.

In the plasma processing apparatus 1B, the controller MC can determine the amount of movement of the second annular part FR2, as described above. The predetermined relationship between the parameter described above and the amount of movement of the second annular part FR2 may be stored in the storage device of the controller MC as a function or table format data. The controller MC can control the sheath adjuster 74B to move the second annular part FR2 upward by the determined amount of movement.

If the upper end position of the sheath is corrected by the sheath adjuster 74B, the impedance of the path of the radio frequency power which reaches the plasma via the edge ring FRB increases. This is because the gap immediately below the second annular part FR2 is widened. If the impedance of the path of the radio frequency power which reaches the plasma via the edge ring FRB increases, the power level of the radio frequency power which is supplied to the edge ring FRB decreases. Further, if the impedance of the path of the radio frequency power which reaches the plasma via the edge ring FRB increases, the power level of the radio frequency power which is supplied to the substrate W increases relatively. As a result, the etching rate of the substrate W inside the edge becomes higher than the etching rate at the edge of the substrate W. Therefore, in the plasma processing apparatus 1B, similar to the plasma processing apparatus 1, the supply timing of the radio frequency power HF is controlled by the controller MC.

Figure 7:
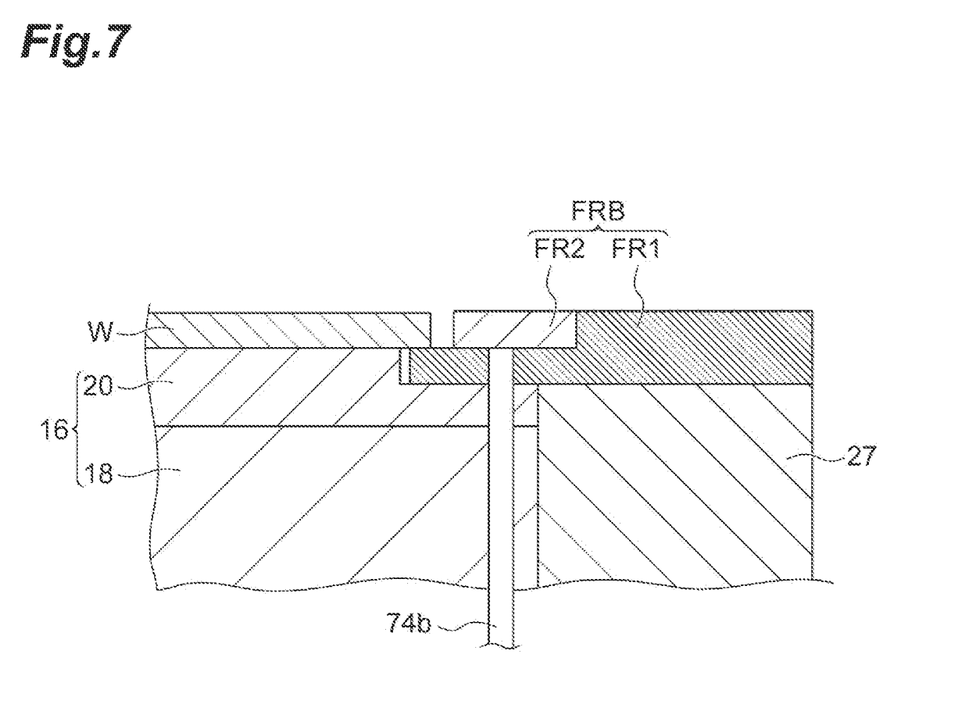
FIG. 7 illustrates another example of the edge ring.

FIG. 7 is a diagram showing another example of the edge ring. In the edge ring FRB shown in FIG. 7, the first annular part FR1 has an inner peripheral portion and an outer peripheral portion. The position in the vertical direction of the upper surface of the inner peripheral portion is lower than the position in the height direction in the vertical direction of the upper surface of the outer peripheral portion. The substrate W is placed on the substrate placing region such that the edge thereof is located on or above the inner peripheral portion of the first annular part FR1. The second annular part FR2 is disposed on the inner peripheral portion of the first annular part FR1 to surround the edge of the substrate W. That is, in the edge ring FRB shown in FIG. 7, the second annular part FR2 is disposed inside the outer peripheral portion of the first annular part FR1. In a case where the edge ring FRB shown in FIG. 7 is used, the shaft 74b of the sheath adjuster 74B extends downward from the second annular part FR2 to penetrate the inner peripheral portion of the first annular part FR1.

Figure 8:
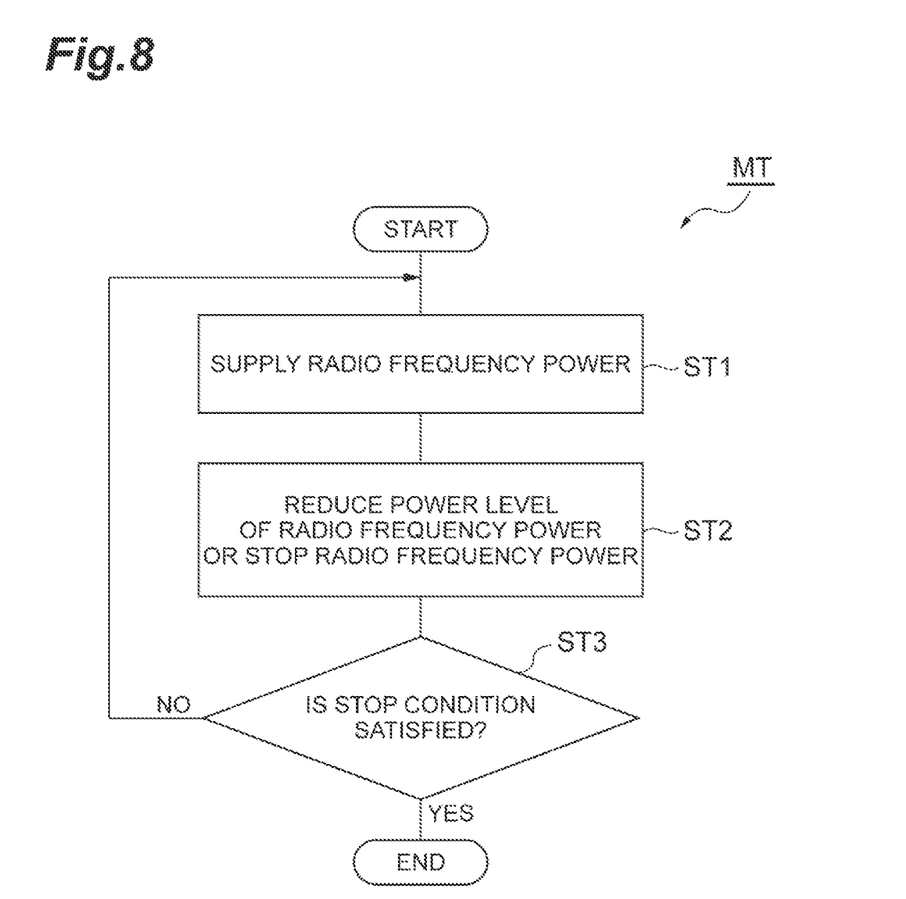
FIG. 8 is a flowchart showing an etching method according to an exemplary embodiment.

Hereinafter, FIG. 8 is referred to. FIG. 8 is a flowchart showing an etching method according to an exemplary embodiment. A method shown in FIG. 8 (i.e. an etching method MT) is performed using any one of plasma processing apparatuses according to various embodiments, such as the plasma processing apparatus 1 and the plasma processing apparatus 1B described above.

The etching method MT is performed in a state where the substrate W is placed on the electrostatic chuck 20. In the etching method MT, a gas is supplied from the gas supply unit into the chamber 10. Then, the pressure in the chamber 10 is set to a designated pressure by the exhaust device 50. Then, in the etching method MT, as the bias power described above, the radio frequency bias power LF or the pulsed direct-current voltage VB is supplied to the lower electrode 18.

In the etching method MT, step ST1 is executed. Step ST1 is executed in at least a part of the first period $P_1$ in the cycle $P_B$ of the bias power. In step ST1, the radio frequency power HF is supplied. Subsequent step ST2 is executed in the second period $P_2$ in the cycle $P_B$ of the bias power. In step ST2, the power level of the radio frequency power HF is reduced to be lower than the power level of the radio frequency power HF in the first period $P_1$, or the supply of the radio frequency power HF is stopped. In the etching method MT, ions in the plasma generated in the chamber 10 in the first period $P_1$ are accelerated toward the substrate W in the second period $P_2$, whereby the substrate W is etched. In the etching method MT, the position in the vertical direction of the upper end of the sheath is adjusted by the sheath adjuster (the sheath adjuster 74 or the sheath adjuster 74B) in the first period $P_1$ and the second period $P_2$.

In step ST3, whether a stop condition is satisfied or not is determined. The stop condition is satisfied in a case where the number of repetitions of step ST1 and step ST2 has reached a predetermined number of times. In step ST3, if it is determined that the stop condition is not satisfied, step ST1 and step ST2 are executed again. On the other hand, in step ST3, if it is determined that the stop condition is satisfied, the execution of the etching method MT is ended.

While various exemplary embodiments have been described above, various additions, omissions, substitutions and changes may be made without being limited to the exemplary embodiments described above. Elements of the different embodiments may be combined to form another embodiment.

The plasma processing apparatus according to another embodiment may be a capacitively coupled plasma processing apparatus different from the plasma processing apparatus 1 and the plasma processing apparatus 1B. Further, the plasma processing apparatus according to still another embodiment may be an inductively coupled plasma processing apparatus. Further, the plasma processing apparatus according to still another embodiment may be an ECR (electron cyclotron resonance) plasma processing apparatus. Further, the plasma processing apparatus according to still another embodiment may be a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for plasma processing comprising:
a chamber;
a substrate support having an electrostatic chuck configured to support a substrate which is placed thereon in the chamber;
a sheath adjuster configured to adjust a position in a vertical direction of an upper end of a sheath above an edge ring which is disposed to surround an edge of the substrate;
a radio frequency power source configured to generate radio frequency power having a first frequency to generate a plasma from a gas in the chamber;
a bias power source electrically connected to the substrate support and configured to supply bias power, having a second frequency that is lower than the first frequency, to the substrate support periodically at a time interval having a time length which is a reciprocal of the second frequency; and
a controller configured to control the sheath adjuster and the radio frequency power source, wherein
the bias power causes a potential of the substrate placed on the electrostatic chuck in a first period within the time interval of the bias power to be higher than an average of the potential of the substrate in the time interval and causes the potential of the substrate placed on the electrostatic chuck in a second period within the time interval of the bias power to be lower than the average, the second period being an entire remaining period within the time interval other than the first period,
the controller is configured to:
control the radio frequency power source to supply the radio frequency power having the first frequency in at least a part of the first period in the time interval of the bias power, and reduce, in the second period in the time interval of the bias power, a power level of the radio frequency power having the first frequency to be lower than a power level of the radio frequency power having the first frequency in the first period; and
control the sheath adjuster to adjust the position in the vertical direction of the upper end of the sheath in the first period and the second period.

2. The apparatus according to claim 1, wherein
the controller is configured to control the radio frequency power source to stop supply of the radio frequency power having the first frequency in the second period.

3. The apparatus according to claim 1, wherein
the sheath adjuster is configured to apply a voltage to the edge ring to adjust the position in the vertical direction of the upper end of the sheath.

4. The apparatus according to claim 1, wherein
the sheath adjuster is configured to move the edge ring upward to adjust the position in the vertical direction of the upper end of the sheath.

5. The apparatus according to claim 1, wherein
the bias power is a radio frequency bias power having a sinusoidal waveform of which a frequency is the second frequency,
the first period is a period during which the radio frequency bias power which is output from the bias power source has a positive potential, and
the second period is a period during which the radio frequency bias power which is output from the bias power source has a negative potential.

6. The apparatus according to claim 1, wherein
the bias power is a pulsed direct-current voltage which is supplied to the substrate support periodically at the time interval,
the first period is a period during which the pulsed direct-current voltage is not applied to the lower electrode, and
the second period is a period during which the pulsed direct-current voltage having a negative polarity is applied to the lower electrode.

7. The apparatus according to claim 1, further comprising
a voltage sensor configured to measure the potential of the substrate.

8. The apparatus according to claim 1, wherein
the substrate support includes a lower electrode provided below the electrostatic chuck, and the bias power is supplied to the lower electrode.

9. The apparatus according to claim 1, wherein
the bias power is a negative pulsed direct-current voltage.

10. The apparatus according to claim 1, wherein
the bias power is a radio frequency bias power having a sinusoidal waveform of which a frequency is the second frequency and supplied to the substrate support periodically at the time interval, or the bias power is a pulsed direct-current voltage which is supplied to the substrate support periodically at the time interval.

11. A method of etching in an apparatus for plasma processing, the apparatus including:
a chamber;
a substrate support having an electrostatic chuck configured to support a substrate that is placed thereon in the chamber;
a sheath adjuster configured to adjust a position in a vertical direction of an upper end of a sheath above an edge ring which is disposed to surround an edge of the substrate;
a radio frequency power source configured to generate radio frequency power having a first frequency to generate a plasma from a gas in the chamber; and
a bias power source electrically connected to the substrate support and configured to supply bias power, having a second frequency that is lower than the first frequency, to the substrate support periodically at a time interval having a time length which is a reciprocal of the second frequency wherein
the bias power causes a potential of the substrate placed on the electrostatic chuck in a first period within the time interval of the bias power to be higher than an average of the potential of the substrate in the time interval and causes the potential of the substrate placed on the electrostatic chuck in a second period within the time interval of the bias power to be lower than the average, the second period being an entire remaining period within the time interval other than the first period, the method is performed in a state where the substrate is placed on the electrostatic chuck, and comprises:

supplying the radio frequency power having the first frequency in at least a part of the first period in the time interval of the bias power cycle; and reducing, in the second period in the time interval of the bias power, a power level of the radio frequency power having the first frequency to be lower than a power level of the radio frequency power having the first frequency in the first period, wherein ions in the plasma generated in the chamber in the first period are accelerated toward the substrate in the second period, whereby the substrate is etched, and in the first period and the second period, the position in the vertical direction of the upper end of the sheath is adjusted by the sheath adjuster.

12. The method according to claim 11, wherein in the second period, supply of the radio frequency power having the first frequency is stopped.

13. The method according to claim 11, wherein the sheath adjuster is configured to apply a voltage to the edge ring to adjust the position in the vertical direction of the upper end of the sheath.

14. The method according to claim 11, wherein the sheath adjuster is configured to move the edge ring upward to adjust the position in the vertical direction of the upper end of the sheath.

15. The method according to claim 11, wherein the bias power is a radio frequency bias power having a sinusoidal waveform of which a frequency is the second frequency, the first period is a period during which the radio frequency bias power which is output from the bias power source has a positive potential, and the second period is a period during which the radio frequency bias power which is output from the bias power source has a negative potential.

16. The method according to claim 11, wherein the bias power is a pulsed direct-current voltage which is supplied to the substrate support periodically at the time interval, the first period is a period during which the pulsed direct-current voltage is not applied to the substrate support, and the second period is a period during which the pulsed direct-current voltage having a negative polarity is applied to the substrate support.

17. The method according to claim 11, wherein the bias power is a radio frequency bias power having a sinusoidal waveform of which a frequency is the second frequency and supplied to the substrate support periodically at the time interval, or the bias power is a pulsed direct-current voltage which is supplied to the substrate support periodically at the time interval.

* * * * *